United States Patent [19]

Seidler

[11] Patent Number: 4,679,889
[45] Date of Patent: * Jul. 14, 1987

[54] SOLDER-BEARING LEADS

[75] Inventor: Jack Seidler, Flushing, N.Y.

[73] Assignee: North American Specialties Corporation, College Point, N.Y.

[*] Notice: The portion of the term of this patent subsequent to Aug. 12, 2003 has been disclaimed.

[21] Appl. No.: 793,654

[22] Filed: Oct. 31, 1985

Related U.S. Application Data

[63] Continuation-in-part of Ser. No. 737,830, May 24, 1985, Pat. No. 4,605,278.

[51] Int. Cl.⁴ .............................................. H01R 4/02
[52] U.S. Cl. .................................... 439/876; 29/876; 439/83; 439/637
[58] Field of Search ................. 29/843, 844, 874, 876, 29/884; 339/17 C, 17 LM, 17 M, 258 R, 258 P, 275 R, 275 B, 275 T

[56] References Cited

U.S. PATENT DOCUMENTS

| | | | |
|---|---|---|---|
| 4,120,558 | 10/1978 | Seidler | 339/275 T |
| 4,203,648 | 5/1980 | Seidler | 339/275 T |
| 4,503,609 | 3/1985 | MacKay | 339/258 P |
| 4,596,439 | 6/1986 | Ruehl et al. | 339/258 R |
| 4,597,628 | 7/1986 | Seidler | 339/275 R |
| 4,605,278 | 8/1986 | Seidler | 339/275 B |

Primary Examiner—Gil Weidenfeld
Assistant Examiner—Gary F. Paumen
Attorney, Agent, or Firm—Darby & Darby

[57] ABSTRACT

The present invention relates to a solder-bearing lead for attachment to a contact pad on a printed circuit board or like substrate, or for mounting a circuit component on a substrate, suitable for being continuously stamped from a thick strip of metal at high speed, with an improved arrangement for holding the solder mass to provide the necessary solder for a soldered joint, without weakening the lead. Instead of retaining the solder mass by means of a finger struck from the elongated body of the lead (which for narrow leads might only weakly retain the solder and also weaken the lead by unduly reducing its already small cross-section), the solder mass is retained by one or more pairs of integral tabs or ears initially extending laterally from the elongated blank body, and then bent to form a solder-retaining channel in which the tabs may stake the solder.

12 Claims, 19 Drawing Figures

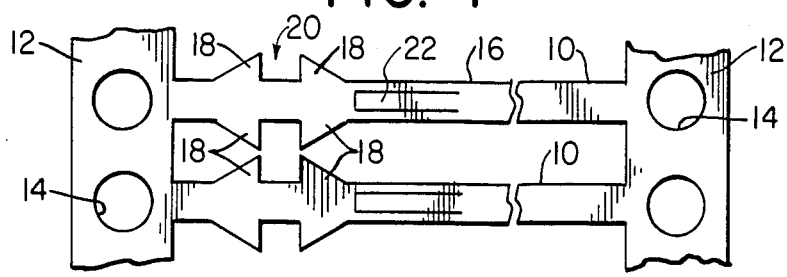
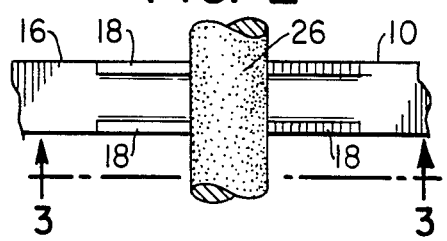
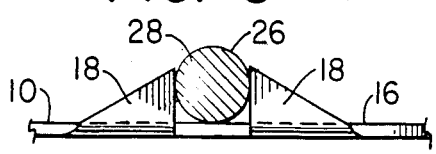
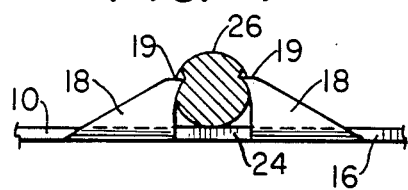
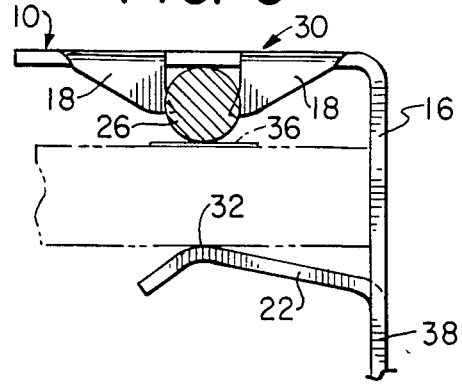
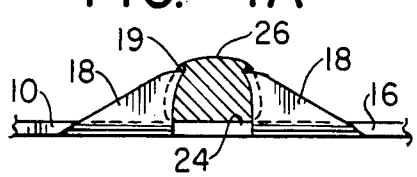
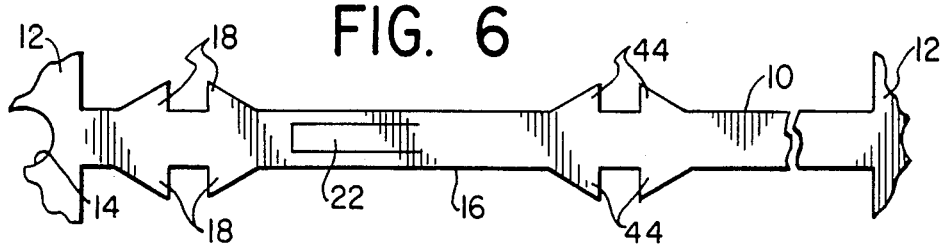

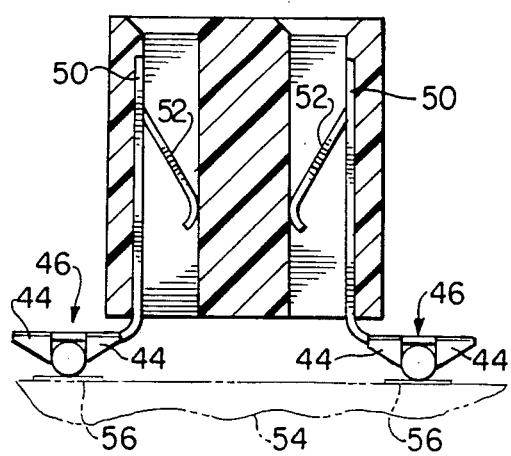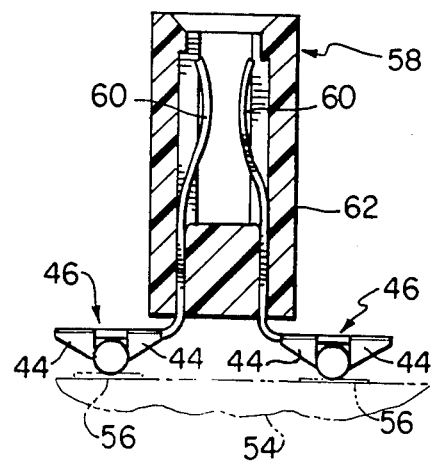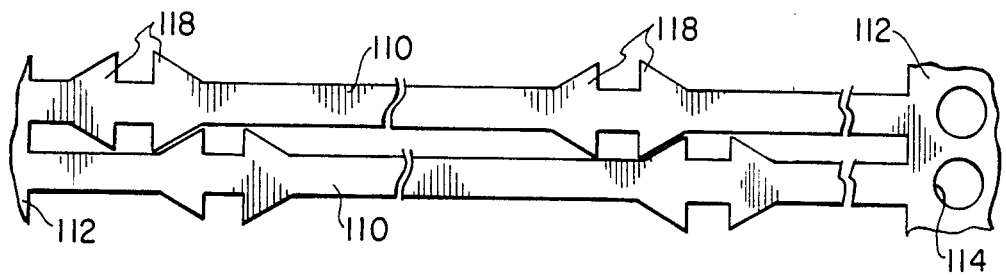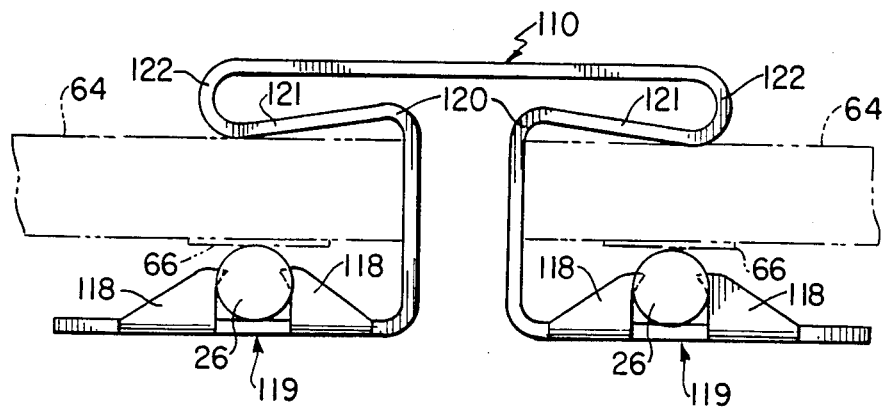

SOLDER-BEARING LEADS

This application is a continuation-in-part of prior application Ser. No. 737,830, filed May 24, 1985 for "Solder-Bearing Leads", now U.S. Pat. No. 4,605,278.

BACKGROUND OF THE INVENTION

This invention relates to solder-bearing contacts, terminal elements and leads, particularly for use with multiple-contact connectors and electronic circuit boards, and for surface-mounted devices.

In the electronic equipment industry, an important necessity is the rapid and accurate assembly of leads, terminals and contacts with the contact pads of printed circuit boards or other substrates. For convenience of connecting such elements, it has previously been suggested to facilitate the soldering of their connection by securing a solder slug or mass to one of the elements so that, when positioned in engagement with the other element and heated, the molten solder will cover the adjacent surfaces of both elements to form when cooled a soldered joint providing both a mechanical coupling and an electrical connection between the elements. Various arrangements of solder-holding elements are disclosed in Seidler Pat. Nos. 4,120,558 and 4,203,648, in each of which a lead has a finger struck from it, for holding the solder mass to the lead.

However, as the art tends toward greater miniaturization in this field, there has been a reduction in the size of and spacing between the contact pads on printed circuit boards, for example, requiring corresponding reduction in the size and spacing of the leads for connection thereto.

SUMMARY OF THE INVENTION

It is a principal object of the present invention to provide a solder-bearing lead for attachment to a contact pad on a printed circuit board or like substrate, or for mounting a circuit component on a substrate, suitable for being continuously stamped from a thick strip of metal at high speed, with an improved arrangement for holding the solder mass to provide the necessary solder for a soldered joint, without weakening the lead. Instead of retaining the solder mass by means of a finger struck from the elongated body of the lead (which for narrow leads might only weakly retain the solder and also weaken the lead by unduly reducing its already small cross-section), the solder mass is retained by integral tabs or ears initially extending laterally from the elongated blank body, and then bent to form a solder-retaining channel in which the tabs may stake the solder. This provides a secure mechanical attachment for the solder mass to the lead, to provide each lead with the necessary supply of solder at a proper location for its attachment to and electrical bonding to another conductive surface. This is particulrly desirable for surface-mounted devices on printed circuit boards or other substrates. In addition, this arrangement can be made by automatic progressive stamping by simple and efficient steps, at high speed.

The invention accordingly comprises an article of manufacture and method of fabrication possessing the features, properties and relation of elements exemplified in the embodiments described in the following, the scope of the invention being set out in the appended claims.

BRIEF DESCRIPTION OF THE DRAWINGS

With particular reference to the drawings, several forms of the invention are shown in the various figures, where like reference characters designate like parts throughout the several views. In the drawings, FIG. 1 shows a plan view of a strip formed into flat blanks for use in making one embodiment of the improved lead of the invention;

FIG. 2 is a plan view of one of the leads made from the blank of FIG. 1, formed to hold a solder mass;

FIG. 3 is a sectional elevation view of the arrangement of FIG. 2, showing the solder mass positioned between retaining tabs;

FIG. 4 shows the arrangement of FIG. 3 with the retaining tabs staked into the solder mass;

FIG. 4A shows an alternative arrangement to that of FIG. 4;

FIG. 5 shows a side sectional elevational view of an edge clip solderable connector for a printed circuit board or the like, made from the blank of FIG. 1;

FIG. 6 shows a plan view of a modified form of the stamped blank for another embodiment of the invention;

FIG. 9 shows a transverse elevation sectional view of a vertically mounted pin-receiving connector adapted for surface mounting on a substrate by use of the solderable lead of the present invention;

FIG. 10 is a transverse elevation sectional view of another connector for a vertically mounted printed circuit board, adapted to be mounted on a substrate by use of the solderable lead of the present invention;

FIG. 11 shows a plan view of an alternate form of strip of blanks useful in connection with the previous embodiments of the present invention for economy of material and providing closer spacing of the leads;

FIG. 12 shows a side elevational view of a connector arrangement according to the invention for joining two printed circuit boards or the like in coplanar alignment;

DESCRIPTION OF PREFERRED EMBODIMENTS

Figure 7:
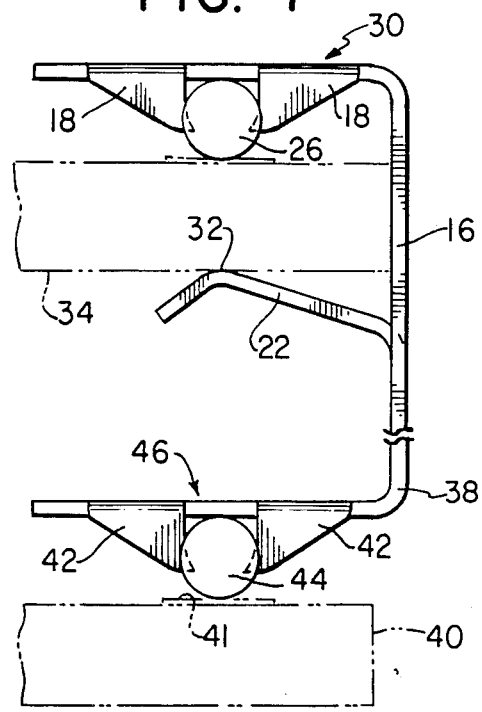
FIG. 7 shows a side elevation view of an edge clip for a printed circuit board, which may be formed from the blank of FIG. 6, and is adapted for surface mounting on a substrate.

Referring to the drawings, FIG. 1 illustrates a stamped strip having a sequence of individual blanks 10 for the leads of the invention, formed by stamping from a conductive strip (as of beryllium copper or like resilient and conductive material), with the individual lead blanks 10 extending between a pair of carrier strips 12. Strips 12 may carry sprocket holes 14 for indexing the lead blanks step-by-step through subsequent progressive stamping steps for forming the blanks into final form.

Each lead is formed of an elongated body section 16 of length appropriate for the intended use of the finished lead, and having oppositely extending tabs 18 on its lateral edges, in the form of sloping extensions with a gap 20 therebetween. The gap 20 is dimensioned to have a width substantially equal to the width of a solder wire to be laid therein, and a depth dimension somewhat less than the solder wire dimension, as will be seen. In addition, the body section 16 is slitted or cut to form a resilient finger 22. It will be understood that the tabs are not necessarily triangular in shape but may be rectangular or of other shape, preferably with straight edges extending transversely of the lead body.

For holding a solder mass or slug to the lead, in the forming process, the tabs 18 are bent out of the plane of the body section 16 into a position substantially perpendicularly, as shown in FIGS. 2 and 3, thereby providing a channel 24 having a "floor" formed by the body section 16, and sides formed by the edges of the tabs 18. Into this channel is laid solder, preferably as a wire 26. The wire 26 may be cut on either side of the body 16 an appropriate distance from the tabs 18 to supply the desired amount of solder for the soldering operation. The solder wire 26 preferably closely conforms to the width of the channel 24, and may be flush with or extend somewhat above the channel 24, as seen in FIG. 3, so that the solder has an exposed surface 28. After the solder wire is positioned within channel 24, and either before or after it is cut into the appropriate section lengths, the tabs 18 may be bent inwardly to stake the solder mass 26 in place and thereby retain it physically connected to the body section 16, as shown in FIG. 4.

FIG. 4A shows an alternative configuration to that of FIG. 4, where the solder mass 26 is pushed into the channel 24 to nearly fill the channel, and to offer a lower profile so that on juxtaposition to the element to which the lead is to be soldered, the tabs 18 will be closer to that element, to improve the reliability of soldering. The exposed surface 28 may have the solder mass flush with the tabs 18, or even slightly recessed into channel 24, as desired, so as to permit even closer contact, before soldering, between the retaining tabs and the corresponding element to which they are to be soldered.

With the solder mass projecting very slightly outwardly of the retaining tabs, upon insertion of the circuit board to be soldered into the gap between a pair of solder masses (or between one solder mass and a resilient opposed member as in FIG. 7), the insertion of the circuit board will serve to wipe off excess solder (which is relatively soft) and smear it over the adjacent portion of the contact pad, which will assist in obtaining a good solder joint.

It will be understood that this solder-retaining arrangement, depicted in FIGS. 2 to 4 and 4A, may be used in various applications in the electronics art, some of which are described below.

In one use, the blank 10 of FIG. 1 may be formed with a resilient finger 22. As seen in FIG. 5, the solder-bearing portion 30 of the lead is bent substantially at a right angle to the remainder of the body portion 16 and the spring finger 22 is positioned with a bend 32 opposite the solder mass 26. This provides a springy gap between the solder 26 and the bend 32 within which may be inserted a circuit board or other substrate 34, having a conductive area or contact pad 36 to which it is desired to solder the lead. The resilience of finger 22 serves to retain the lead in position on the circuit board 34 before the soldering is done, and as the solder melts upon application of heat, the finger 32 serves to allow the tabs 18 to move relatively toward and into contact with the conductive area 36, to provide good electrical contact between the lead and the conductive area 36 when the solder re-solidifies. In this application, the lead forms an edge clip for the circuit board 34, and the terminal end 38 of the lead may be suitably formed in a number of ways for connection to other equipment, such as being formed as a pin for insertion into a contact receptacle, or as a wire-wrap post termination, or as a further solderable arrangement, indicated below.

Figure 8:
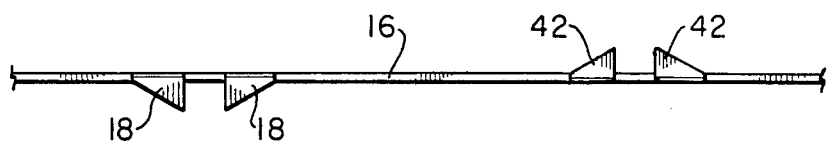
FIG. 8 shows a side elevation view of a partially formed blank for the embodiment of FIGS. 6 and 7.

FIG. 6 shows a modified form of strip blank carrying a lead blank as a modification of FIG. 1. In this form each lead blank is provided with a second set of solder-retaining tabs 44. As shown in FIG. 7, the terminal portion 38 of the lead is formed with a solder-retaining arrangement 46 essentially the same as arrangement 30 of FIG. 5. However, in this instance, the tabs 44 are bent from the body portion 16 in a direction opposite to that of the tabs 18, as shown in FIG. 8, so that the terminal solder-retaining arrangement 46 may be used for surface mounting the circuit board 34 on a further substrate 40 for connection to a conductive area 41 on substrate 40.

In an alternate form (not illustrated), the tabs 44 may be bent in the same direction as tabs 18, in which case the terminal portion 38 of the lead, instead of extending to the left as seen in FIG. 7, would extend to the right.

The solder-retaining arrangement of the present invention may also be used as a terminal portion of other forms of leads, terminals, contacts, and connectors. Thus, as seen in FIG. 9, the solder-retaining arrangement 46 may be the terminal for a contact 50 of a multiple-contact connector where each contact 50 is in a channel 48 into which extends a spring finger 52 integrally formed with the contact 50, for mating contact with a pin when inserted into channel 48. FIG. 9 illustrates a cross-section of a dual row of pin-receiving receptacles, each formed as shown in FIG. 9. It will be understood that the same arrangement may be used for single-row or other multiple-row connectors, permitting surface mounting upon a substrate having conductive areas 56 to which the contacts 50 are to be soldered. While the channels 48 are shown in this instance as perpendicular to the substrate 54, suitable for a vertically oriented connector, other arrangements may be made by which the connector may be oriented horizontally or at other angles.

FIG. 10 illustrates use of the solder-retaining terminal arrangement 46 for surface mounting a circuit board connector 58 on a substrate 54. This figure shows a transverse cross-section of a multiple-contact circuit board edge-connector having a housing 62 in which are mounted spring contacts 60 for separable connection to contact pads on the circuit board when inserted. It will be obvious how the blanks for forming the leads and contacts of FIGS. 9 and 10 are formed. In each case, there will be tabs such as 44 or 18 bent outwardly from the body of the lead, the remainder of the lead being suitably formed for its intended purpose as in FIGS. 5, 7, 9 or 10.

As shown in FIG. 1, the blanks 10 formed into the multiple blank strip are generally side-by-side and in alignment. However, in some instances it may be desirable to place them closer together, as for automatic insertion into housings having closely-spaced channels, or for purposes of economizing on waste material. FIG. 11 shows how the blank leads 10 may be staggered on the carrier strip to place them more closely for this purpose.

FIG. 12 shows a form of the invention adapted for joining two printed circuit boards or substrates 64 in co-planar alignment. In this instance, the terminal body 110 is formed at each end with a solder-bearing and holding arrangement 119 formed by ears or tabs 118 similar to tabs 18 of FIG. 4. Each of these solder-holding arrangements 119 is adapted for soldering to a contact pad 66 of a respective substrate or printed circuit board 64. The contact body 110 joining the two solder-bearing portions 119 is bent at 120 and 122 to form two resilient portions 121, each cooperating with a solder-holding portions 119 to retain a substrate 64 therebetween during the soldering operation.

Figure 13:
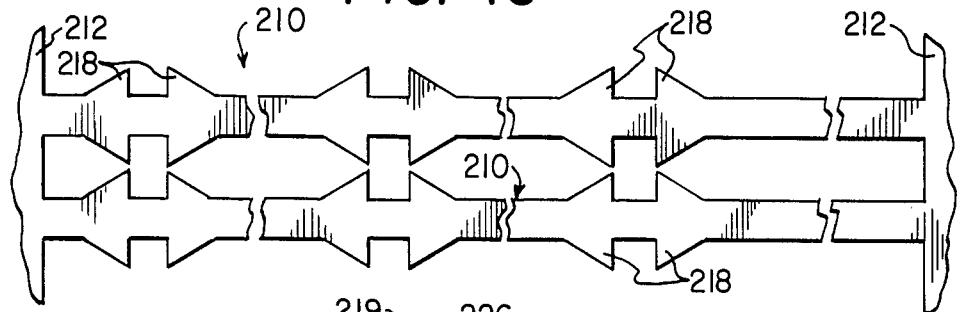
FIG. 13 shows a plan view of a modified form of stamped blank for another embodiment of the invention.

FIG. 13 shows another form of blank usable in another embodiment of the invention. In this instance, the terminal body 210 extending between the carrier strips 212 has three sets of ears or tabs 218 for the purpose of retaining three solder masses. This blank of FIG. 13 may be bent in the form of FIG. 14, so that two of the solder-retaining arrangements 219 straddle the substrate 224 for soldering to contact pads 226 thereon. The third solder-bearing arrangement 219' is adapted for surface mounting the substrate 226 and its connected terminal 210 to an additional substrate 228 having a contact pad 229 thereon, in evident manner.

Figure 15:
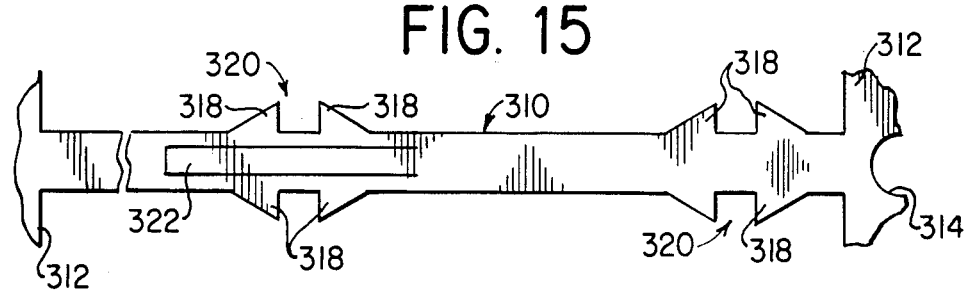
FIG. 15 shows a plan view of still another embodiment of a stamped blank constituting a form of the invention.
Figure 16:
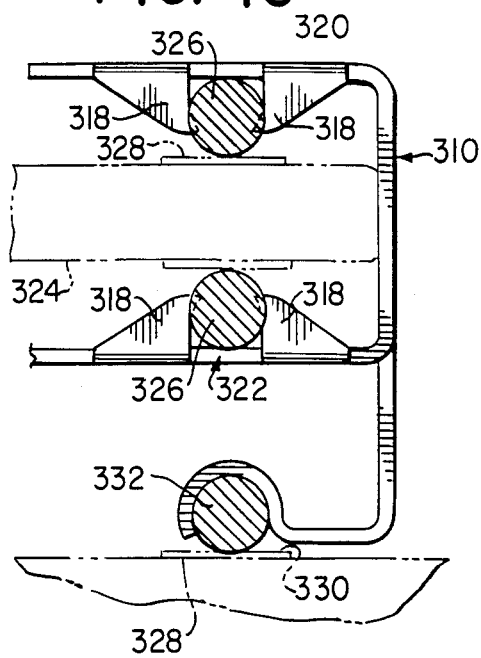
FIG. 16 is a side elevation view, partly in section, of another embodiment of a device similar to FIG. 14, showing a different form of solderable surface mounting.

FIG. 15 shows still another blank having two solder-holding arrangements 320 and 322 formed by solder-retaining tabs 318. In addition, a spring finger 322 may be cut or punched out from the center of the terminal body 310. As shown in FIG. 16, the solder-retaining arrangements 320 and 322, similar to those disclosed above, are adapted for soldering to the respective contact pads 326 of a substrate 324. The finger 322 may be used for surface mounting the entire arrangement on an additional substrate 328, having a contact pad 330, by being wrapped around a solder mass 332 by at least 180° to retain the solder mass 332 between the pad 330 and the terminal 322, pending the soldering operation.

Figure 17:
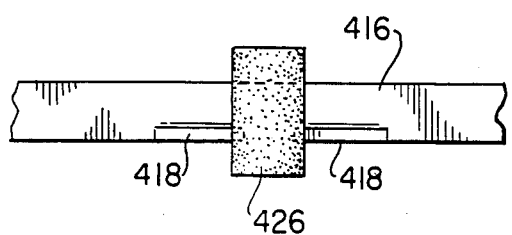
FIG. 17 is a fragmentary plan view of a modification of the invention having a single pair of ears for retaining the solder mass.

While in each of the foregoing arrangements the solder mass exemplified by 26 or 126 or the like has been shown as held by two sets of ears or tabs 218, one set being bent up from each edge of the main lead body, it will be understood that at some instances a single pair of tabs 418 may be used as shown in FIG. 17. This will have the advantage of permitting use of a narrower blank with a saving of material, where satisfactory retention of the solder slug is obtainable.

Figure 18:
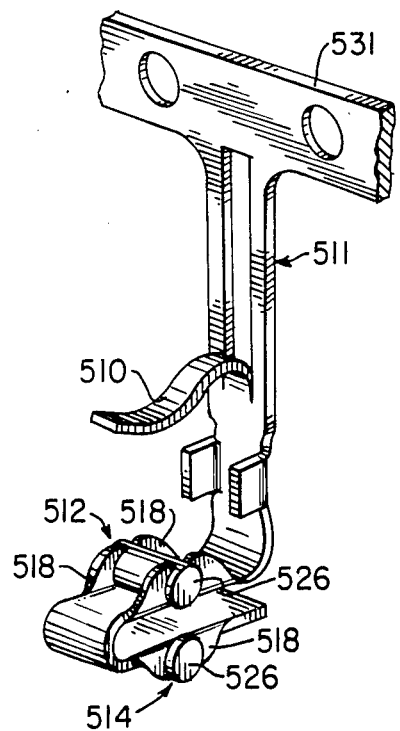
FIG. 18 is a perspective view of another form of terminal connector according to the invention.

FIG. 18 shows a perspective view of a special contact 511 to connect a substrate to a second substrate by surface mounting. The contact 511 is carried on a carrier strip 531, which may be cut away (together with any unneeded section of the contact body) upon or prior to attachment of contact 511 with a substrate. In this structure, a spring finger 510 cooperates with a solder-bearing arrangement 512 of any of the types indicated above, to form a gap therebetween to receive a substrate which carries contact pads. A lower contact pad on such substrate may be soldered to the contact 511 by means of the solder arrangement 512 while the upper spring finger 510 serves to clamp the solder-holding arrangement 512 in position during the soldering operation. This spring finger 510 may also be used to connect a contact pad or circuit portion on the upper side of the substrate to the contact 511 and to the lower contact pad to which it is soldered by the solder arrangement 512.

Figure 14:
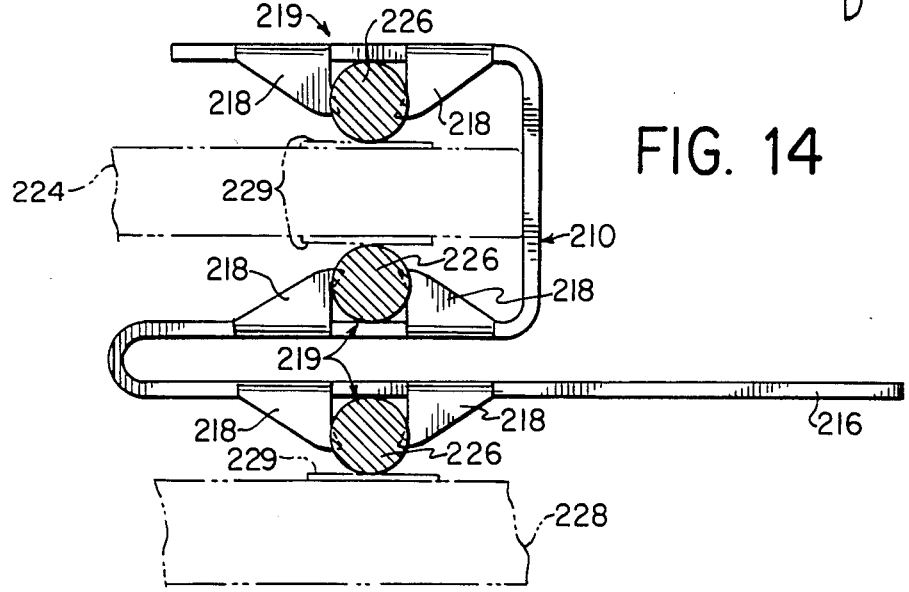
FIG. 14 shows a side elevation view, partly in cross-section, of a clip for a circuit board or the like, made from the blank of FIG. 13, and adapted for surface mounting the circuit board on a substrate.

A second solder arrangement 514 is supplied, which may be of any of the types described above, and permits the entire arrangement of substrate and terminal to be surface mounted and soldered to an additional substrate, generally as shown in FIGS. 14 and 16.

FIG. 18 also shows a modified arrangement for holding the solder slug 526 between the ears 518 in a fashion where the solder 526 is essentially flush with the edge of the tabs 518, to facilitate contact between the tabs 518 and the contact pad to which it is to be soldered. It will be understood that this arrangement also may be used in place of those shown in FIGS. 4 and 4A.

It will be understood that the solder-retaining arrangement of the present invention is suitable for many other applications, where it will have the advantages discussed above as well as others. Accordingly, the above embodiments are to be deemed illustrative only and the present invention is defined by the appended claims.

What is claimed is:

1. A solder-bearing lead adapted to be soldered to a conductive surface, comprising:
    an elongated strip-like body portion,
    said body portion having on at least one edge thereof a pair of spaced laterally extending tabs defining an opening therebetween,
    said pair of tabs being bent substantially perpendicular from the body portion strip to form therebetween part of a channel with said body portion forming a floor for said channel,
    a solder mass in said channel and bordered by said pair of tabs,
    said tabs being bent inwardly of said channel to retain said solder mass therein.

2. A solder-bearing lead as in claim 1, wherein said solder mass has a dimension extending away from said body portion at least as great as the extent of said tabs, whereby said solder mass extends flush of outwardly from said channel and may be placed in direct contact with the conductive surface to which said lead is to be soldered, while spacing said tabs from said surface, and upon melting said solder mass, said tabs are permitted to be or move into contact with said conductive surface to make electrical contact therewith and to be retained in such contact upon re-solidification of said solder mass.

3. A solder-bearing lead as in claim 2, wherein said solder dimension is substantially equal to the projection of said tabs away from said body portion.

4. A lead as in claim 1, wherein said tabs and solder mass are adjacent one end of said lead,
    the other end of said lead being formed as an electrical element, whereby said electrical element may be surface-mounted on said conductive surface by juxtaposing said solder mass to said surface, melting said solder, and re-solidifying said solder.

5. A lead as in claim 4, wherein said element is a circuit board edge clip.

6. A lead as in claim, 4, wherein said element is a pin-receiving connector contact.

7. A lead as in claim 4, wherein said element is a circuit board connector contact.

8. A lead as in claim 1, further including a spring finger integral with said lead body portion and positioned opposite to said solder mass to form a clip arrangement for a circuit board or the like.

9. A terminal for a circuit component for surface mounting it on a substrate having a conductive area, comprising a solder-bearing lead as in claim 1, where said tabs are located adjacent one end of said lead and in a position to be juxtaposed to said conductive area of said substrate.

10. A method of forming a solder-bearing lead adapted to be soldered to a conductive surface, comprising the steps of:
  forming a flat elongated strip-like blank with a body portion,
  said blank having on an edge of said body portion a pair of laterally extending spaced tabs with an opening therebetween,
  bending said pair of tabs on said one edge of said body portion substantially perpendicularly of said body portion,
  placing a solder mass in said tab opening and on said body portion, and
  staking the edges of said tabs with said solder mass to secure said solder mass to said body portion.

11. A method as in claim 10, wherein said solder mass is substantially level with the tips of said tabs.

12. The method of claim 10, wherein said solder mass is depressed below the tips of said tabs.

* * * * *

UNITED STATES PATENT AND TRADEMARK OFFICE
CERTIFICATE OF CORRECTION

PATENT NO.   : 4,679,889
DATED        : July 14, 1987
INVENTOR(S)  : Jack Seidler Page 1 of 1

It is certified that error appears in the above-identified patent and that said Letters Patent is hereby corrected as shown below:

<u>Title page,</u>
[*] Notice: please delete
"The portion of the term of this patent subsequent to Aug. 12, 2003, has been disclaimed."

please add

-- The term of this patent shall not extend beyond the expiration date of Pat. No. 4,605,278. --

Signed and Sealed this

Nineteenth Day of March, 2002

Attest:

Attesting Officer

JAMES E. ROGAN
Director of the United States Patent and Trademark Office